United States Patent
Iwamiya

(10) Patent No.: US 6,704,197 B2
(45) Date of Patent: Mar. 9, 2004

(54) ELECTRONIC UNIT HAVING DESIRED HEAT RADIATION PROPERTIES

(75) Inventor: Hironori Iwamiya, Nukata-gun (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 10/135,576

(22) Filed: May 1, 2002

(65) Prior Publication Data

US 2002/0172011 A1 Nov. 21, 2002

(30) Foreign Application Priority Data

May 17, 2001 (JP) .......................... 2001-148255

(51) Int. Cl.[7] .................................................. H05K 7/20
(52) U.S. Cl. ........................................................ 361/690
(58) Field of Search ............................ 361/688–690, 361/703–707, 717–720; 174/16.3, 252; 165/80.3, 185; 257/701, 697, 706, 707, 713, 781

(56) References Cited

U.S. PATENT DOCUMENTS

| | | | |
|---|---|---|---|
| 3,629,549 A | * 12/1971 | Svendsen | ............... 219/216 |
| 4,163,963 A | * 8/1979 | Ryckman, Jr. | ............... 338/28 |
| 5,235,347 A | * 8/1993 | Lee | ............... 347/238 |
| 5,253,702 A | * 10/1993 | Davidson et al. | ............ 165/80.4 |
| 2002/0020910 A1 | 2/2002 | Kinouchi et al. | |
| 2002/0021553 A1 | 2/2002 | Fukatsu et al. | |

FOREIGN PATENT DOCUMENTS

| | | |
|---|---|---|
| JP | A-5-60607 | 3/1993 |
| JP | A-5-235093 | 9/1993 |
| JP | A-7-161884 | 6/1995 |
| JP | A-7-190675 | 7/1995 |
| JP | A-10-116944 | 5/1998 |

\* cited by examiner

*Primary Examiner*—Gerald Tolin
(74) *Attorney, Agent, or Firm*—Posz & Bethards, PLC

(57) ABSTRACT

An electronic unit includes a housing and a plurality of heat-generating electronic devices. The devices are stored in the housing. The heat generated by the devices is transferred to the housing and further transferred to ambient air from the housing to cool the electronic unit. A sheet of paper, which is made of art paper having a thermal emissivity higher than the housing, is adhered to an outer surface of the housing to improve the heat radiation from the housing to the ambient air.

18 Claims, 2 Drawing Sheets

ELECTRONIC UNIT HAVING DESIRED HEAT RADIATION PROPERTIES

CROSS REFERENCE TO RELATED APPLICATION

This application is based on and incorporates herein by reference Japanese Patent Application No. 2001-148255 filed on May 17, 2001.

BACKGROUND OF THE INVENTION

1. Field of the Invention

The present invention relates to an electronic unit, which includes a housing and a heat-generating electronic device stored in the housing. The heat generated in the device is transferred to the housing and efficiently transferred from the housing to the ambient air to cool the device.

2. Description of the Related Art

A proposed electronic unit includes a housing, which is made of metal such as aluminum, a plurality of heat-generating electronic devices, and a plate such as a ceramic substrate and a printed wiring board. The electronic devices are assembled on the plate. The plate assembled with the devices is stored in the housing. In the proposed electronic unit, each heat-generating electronic device is in contact directly with an inner surface of the housing, or a heat-conductive member is located between each device and the surface, so the heat generated in each device is conducted to the housing and transferred from the housing to the ambient air. To effectively transfer the heat from the housing to the ambient air, the housing of the proposed unit is relatively large or is air-cooled with a fan. If a fan is used, the proposed unit must be relatively large to accommodate the fan.

As a solution to the above issue, cationic electrocoating or anodic oxide coating is usually applied to the housing to improve heat radiation from the housing. Alternatively, a heat radiation material is proposed in JP-A-7-190675. The material improves the heat radiation properties of a body, to which the material is attached. The material is made of a mixture of dimetylsilicone, cordierite particles, and copper powders.

However, the cationic electrocoating, the anodic oxide coating, and the method of the publication require dedicated materials or apparatus, which are relatively expensive. Therefore, the production cost of the electronic unit is increased.

SUMMARY OF THE INVENTION

The present invention has been made in view of the above aspects with an object to provide an electronic unit, which is economy and compact and has desired heat radiation properties.

In the present invention, a sheet of paper, which has a thermal emissivity higher than a housing of the electronic unit, is adhered to an outer surface of the housing to improve the heat radiation from the housing to ambient air. Art paper, which is relatively affordable, is used for the sheet of paper.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

The present invention will be described in detail with reference to various embodiments.

First Embodiment

Figure 1:
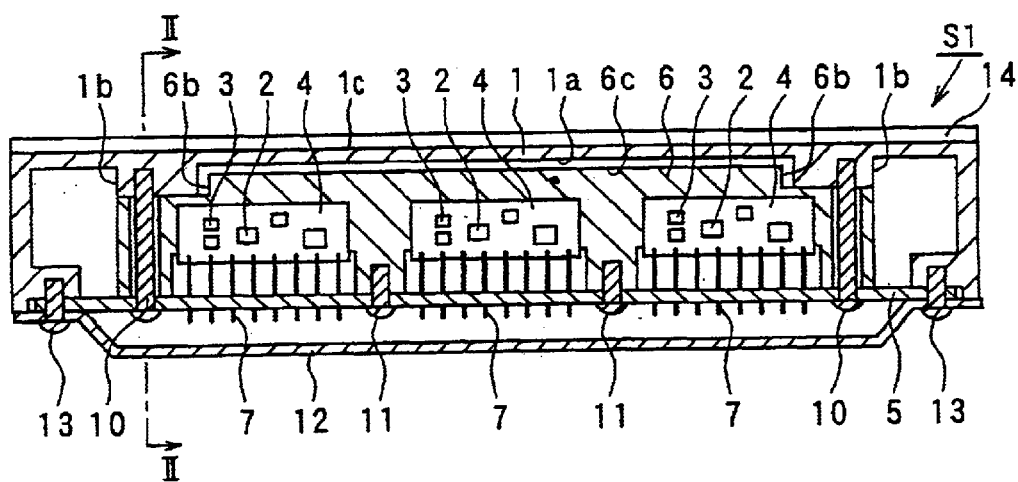
FIG. 1 is a cross-sectional view of an electronic unit according to the first embodiment of the present invention.

As shown in FIG. 1, an electronic unit S1 has an aluminum housing 1 formed by die casting. The housing 1 is 193 mm long in the horizontal direction of FIG. 1 and 30 mm long in the vertical direction of FIG. 1. The housing 1 is 170 mm long in the horizontal direction of FIG. 2. An outer surface 1C of the housing 1 has an area of about 330 cm$^2$. The housing 1 stores a printed wiring board 5, on which a plurality of ceramic substrates 4 are assembled. Each ceramic substrate 4 has a similar structure and is similarly assembled, so only one substrate 4 will be described. The substrate 4 includes a plurality of electronic parts 3 such as an IC chip and a ceramic condenser. The ceramic substrate 4 also includes a plurality of heat-generating electronic devices 2 such as a power transistor, which is not embedded in mold resin. Each electronic part 3 and each heat-generating electronic device 2 is assembled on the ceramic substrate 4 with solder or electrically conductive adhesive. Each ceramic substrate 4 is a module that has a function different from the other substrates 4. Therefore, the electronic unit S1 is readily diversified by choosing a ceramic substrate 4 (module) on the basis of functional requirements.

In general, the ambient temperature outside of each heat-generating electronic device 2 steeply decreases in the proximity of the device 2 and gently decreases outside of the proximity. Therefore, each device 2 is located on the ceramic substrate 4 in consideration of the proximity to balance the thermal interference between the plurality of devices 2 and the packing density of the plurality of devices 2. Specifically, each device 2 is arranged at a location such that an edge of one device 2 is at the position where the temperature gradient per watt of an adjacent device 2 is 0.1° C./mmW. In the electronic unit S1 in FIG. 1, the plurality of devices 2 are arranged on the substrate 4 at intervals of 3 mm.

Figure 2:
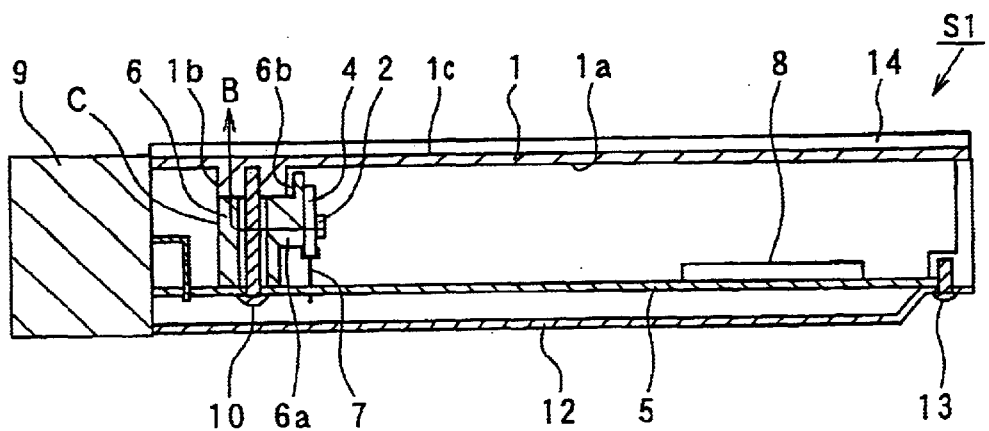
FIG. 2 is a cross-sectional view of the electronic unit taken along the line II—II in FIG. 1.

The ceramic substrate 4 is attached to a heat-transfer fin 6, which is made of a material having relatively high thermal conductivity such as aluminum. As shown in FIGS. 1 and 2, the heat-transfer fin 6 is clamped between the housing 1 and the printed wiring board 5. As shown in FIG. 2, the heat-transfer fin 6 has a projection 6a, to which the ceramic substrate 4 is adhered with silicone adhesive, which has relatively high thermal conductivity. The largest surface of the ceramic substrate 4 is substantially perpendicular to the printed wiring board 5, so the substrate 4 occupies relatively little area on the board 5. The substrate 4 and the board 5 are electrically connected using a plurality of leads 7.

As shown in FIG. 2, a microchip 8 such as microcomputer is located on the printed wiring board 5. The microchip 8 has a relatively low maximum allowable temperature, so the microchip 8 needs to be separated from the heat-generating electronic devices 2. In the electronic unit S1, the microchip 8 is separated from the devices 2 by locating the ceramic substrate 4 on the left end of the printed wiring board 5, as shown in FIG. 2. A connector 9, which has a plurality of leads, is fixed to the left end of the printed wiring board 5. The leads are connected to the printed wiring board 5 by soldering. Other electronic parts (not illustrated) are also electrically connected to the printed wiring board 5.

The heat-transfer fin 6 has recesses 6b at both corners of an upper horizontal surface 6c as viewed in FIG. 1. The bottom surface of each recess 6b is substantially flat. The housing 1 has projections 1b on an inner surface 1a as viewed in FIG. 1. The top surface of each projection 1b is substantially flat. The bottom and top surfaces of each recess 6b and each projection 1b fit with each other. In the electronic unit S1 in FIG. 1, the bottom and top surfaces contact each other with an area of 60 mm². The housing 1 and the heat-transfer fin 6 are usually formed by die-casting, so the housing 1 and the heat-transfer fin 6 have relatively poor flatness. Nevertheless, the housing 1 and the heat-transfer fin 6 are preferably fitted together by the recesses 6b and the projections 1b.

As shown FIG. 1, the printed wiring board 5, the heat-transfer fin 6, and the housing 1 are fastened together with a plurality of screws 10. In addition, the printed wiring board 5 and the heat-transfer fin 6 are fastened together with a plurality of screws 11. The electronic unit S1 in FIG. 1 has a cover 12, which fixed to the housing 1 with screws 13. The heat generated by each heat-generating electronic device 2 is transferred to the heat-transfer fin 6 and further transferred to the housing 1 through pairs of recess 6b and projection 1b. In the electronic unit S1, a sheet of paper 14, which has thermal emissivity higher than the housing 1, is adhered to the entire outer surface 1c of the housing 1 to radiate heat from the housing 1 to ambient air. In the electronic unit S1, the sheet of paper 14 is art paper, a surface of which is coated with adhesive.

When an object transfers heat by natural air convection, radiation and the air convection contribute approximately equally to the heat transfer of the object. Heat-transfer coefficient H by radiation is determined by thermal emissivity R, ambient temperature Ta, and temperature increment dT and expressed in the following equation.

$$H = R \times 5.69 \times 10^{-8} \times \{(Ta+dT)^4 + Ta^4\}/dT$$

Therefore, the heat-transfer coefficient H is proportional to the thermal emissivity R.

The housing 1, which is formed by aluminum die-casting, has a relatively low thermal emissivity of about 0.35, so the heat radiation of the housing is relatively poor, and the temperature of the heat-generating electronic device 2 can rise above the maximum allowable temperature of the device 2. On the other hand, the thermal emissivity of the art paper is about 0.8, that is, about 2.3 times greater than that of the housing 1. Therefore, the heat generated by the heat-generating electronic device 2 is more effectively radiated from the housing 1 to ambient air, and the temperature of the device 2 remains below the maximum allowable temperature.

As denoted by an arrow B in FIG. 2, the heat generated by the device 2 is conducted through the ceramic substrate 4, the heat-transfer fin 6, the housing 1, and the sheet 14 in this order, and heat is transferred from the sheet 14. The effectiveness of the sheet 14 in the heat transfer was confirmed by measuring the thermal resistance of the housing 1 and by comparing the resistance with that of a reference unit, which has the same structure as the electronic unit S1 except for the sheet 14. The thermal resistance is defined as (temperature increment)/(VICP electric power) (° C./W)

at a position C in FIG. 2. The VICP electric power is the rated electric power of the heat-generating electronic device 2. The thermal resistances of the electronic unit S1 and the reference unit having the same structure as the electronic unit S1 except for the sheet 14 are respectively 2.5° C./W and 2.9° C./W. Due to the sheet 14, the resistance of the electronic unit S1 is lower than that of the reference unit by 0.4° C./W.

Figure 3:
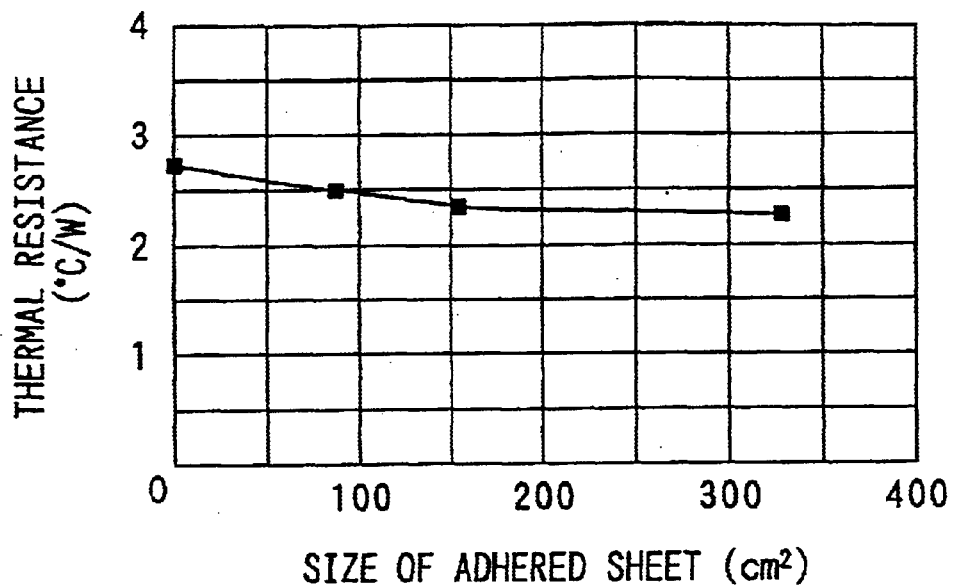
FIG. 3 is a graph showing the correlation between the thermal resistance of the housing and the size of the adhered sheet.

The thickness of the sheet 14 including the adhesive is preferably smaller than 0.3 mm to provide the electronic unit S1 with a desired thermal resistance. As long as the thickness is 0.3 mm or smaller, the resistance of the electronic unit S1 is lower than that of the reference unit by about 0.4° C./W. The graph in FIG. 3 shows the correlation between the thermal resistance and the size of the sheet 14, which adhered to the surface 1c. The heat generated by each heat-generating electronic device 2 is transferred to the housing 1 through each projection 1b, which is located in the left side of FIG. 2, so a hot spot is generated in the surface at a position close to each projection 1b. Due to the hot spot, the surface 1c is hotter in the left side than in the right side of FIG. 2. In an experiment having resulted in the graph in FIG. 3, the sheet 14 is adhered to extend from the hotter side to the colder side of the surface 1c. As shown by the graph, if only the hotter half of the surface 1c is covered by the sheet 14, relatively low thermal resistance is provided. In that case, the cost of the sheet 14 is decreased, and the sheet 14 is adhered more readily to the housing 1 in manufacturing process.

Second Embodiment

Figure 4:
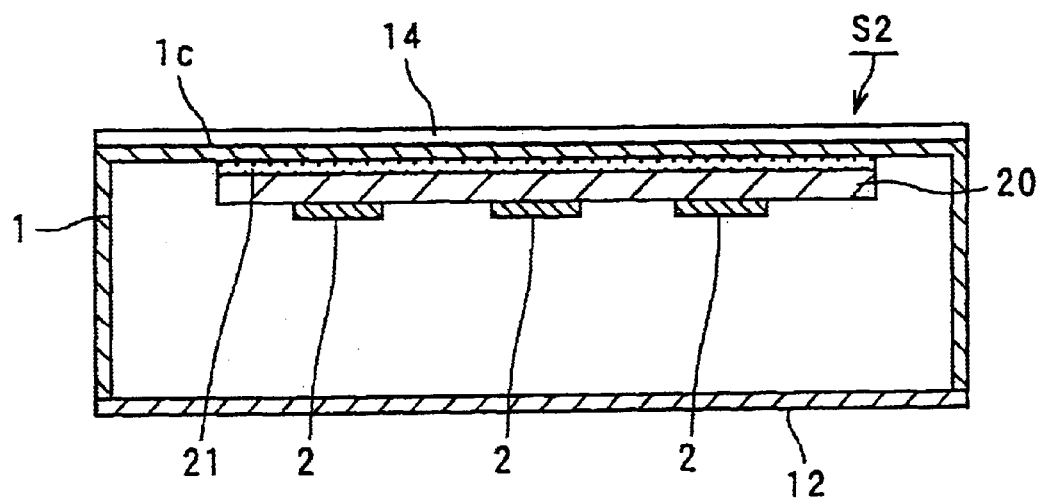
FIG. 4 is a cross-sectional view of an electronic unit according to the second embodiment of the present invention.

As shown in FIG. 4, an electronic unit S2 has a housing 1. The housing 1 stores a ceramic substrate 20. A plurality of heat-generating electronic devices 2 are located on the ceramic substrate 20. Each heat-generating electronic device 2 is assembled on the ceramic substrate 20 with solder or electrically conductive adhesive. The ceramic substrate 20 is fixed to the housing 1 with adhesive 21. The housing is sealed by a cover 12.

A sheet of paper 14 is adhered to an outer surface 1c of the housing 1 to effectively radiate heat from the housing 1 to ambient air. The heat generated by the devices 2 is conducted through the ceramic substrate 20, the housing 1, and the sheet 14 in this order, and heat is transferred from the sheet 14 to the ambient air.

Modifications

The electronic unit S1 has two pairs of projection 1b and recess 6b. However, the number of pairs may be three or more to improve cooling effect. In addition, a material that reduces thermal contact resistance may be placed at the boundary between each pair.

In the electronic unit S1, if the inner surface 1a of the housing 1 and the upper surface 6c of the heat-transfer fin 6 are machined to have a relatively flat surface. The housing 1 and the heat-transfer fin 6 may be fitted together without forming the recesses 6b and the projections 1b.

Each ceramic substrate 4 in the electronic unit S1 is substantially perpendicular to the printed wiring board 5. However, the positional relation between the substrate 4 and the printed wiring board 5 is not limited to perpendicular. For example, the substrate 4 may be substantially parallel to the board 5.

In the electronic units S1 and S2, the sheet of paper 14 is art paper. However, other ordinary paper may be used. Other ordinary paper provides substantially the same cooling effect.

What is claimed is:

1. An electronic unit comprising:

a metal housing;

a plurality of electronic devices stored in the housing, one of which is a heat-generating device, the plurality of electronic devices being separated from each other by a predetermined distance to balance thermal interference therebetween; and a sheet of paper having a thermal emissivity higher than the housing and which is adhered to an outer surface of the metal housing over a predetermined area of the metal housing to improve radiation of heat generated by the heat-generating device from the metal housing.

2. The electronic unit as in claim 1, wherein the sheet of paper includes an adhering material, and the sheet of paper, including the adhering material, has a thickness no greater than 0.3 mm.

3. The electronic unit as in claim 1, wherein the sheet of paper is adhered to the outer surface of the metal housing such that a hot spot of the outer surface of the metal housing is covered by the sheet of paper.

4. The electronic unit as in claim 1, wherein the sheet of paper is adhered to the outer surface of the metal housing such that a half of the surface that is heated to a temperature higher than that of another half during operation of the heat-generating device is covered by the sheet of paper.

5. The electronic unit as in claim 1, wherein the sheet of paper is made of art paper.

6. The electronic unit as in claim 1, wherein the metal housing has a relative length between about 170 mm and 193 mm, and a relative height of about 30 mm.

7. The electronic unit as in claim 1, wherein the metal housing has an area of about 330 cm$^2$.

8. The electronic unit as in claim 1, wherein the metal housing is made from aluminum.

9. The electronic unit as in claim 1, wherein the plurality of electronic devices are separated from each other by a predetermined distance such that an edge of each of the plurality of electronic devices is at a position where a temperature gradient per watt of an adjacent device is 0.1° C./mmW.

10. The electronic unit as in claim 1, wherein at least one of the plurality of electronic devices has a low maximum allowable temperature relative to the at least one heat-generating device.

11. The electronic unit as in claim 1, wherein the thermal emissivity of the metal housing is about 0.35, the thermal emissivity of the sheet of paper is about 0.8.

12. The electronic unit as in claim 1, wherein the plurality of electronic devices are mounted on a ceramic substrate using a thermally conductive material.

13. The electronic unit as in claim 12, wherein:

the ceramic substrate is attached to a heat-transfer fin that includes a plurality of recesses formed on corners thereof, the metal housing includes a plurality of projections formed on an inner surface thereof, and at least two pairs of the plurality of recesses and projections interconnect to thereby form interconnection surfaces for transferring heat generated by the at least one heat-generating device from the heat transfer fin to the housing for radiation by the sheet of paper.

14. The electronic unit as in claim 13, wherein each of the interconnection surfaces has an area of about 60 mm$^2$.

15. An electronic unit comprising:

a metal housing;

a heat-generating electronic device stored in the housing; and a sheet of paper having a thermal emissivity higher than the housing and which is adhered to an outer surface of the metal housing over a predetermined area of the metal housing corresponding to a location of the heat-generating device to improve radiation of heat generated by the heat-generating device from the metal housing.

16. The electronic unit as in claim 15, wherein the heat-generating device is mounted on ceramic substrate using an electrically conductive material.

17. The electronic unit as in claim 16, wherein:

the ceramic substrate is attached to a heat-transfer fin that includes a recess formed on a corner thereof, the metal housing includes a projection formed on an inner surface of the metal housing, and the recess and the projection interconnect to thereby form an interconnection surface for transferring heat generated by the heat-generating device from the heat transfer fin to the housing for radiation by the sheet of paper.

18. The electronic unit as in claim 17, wherein the interconnection surface has an area of about 60 mm$^2$.

* * * * *